(12) United States Patent
Wu et al.

(10) Patent No.: US 12,712,464 B2
(45) Date of Patent: Aug. 18, 2026

(54) PHOTOVOLTAIC INVERTER

(71) Applicant: DELTA ELECTRONICS, INC., Taoyuan City (TW)

(72) Inventors: Chun-Wei Wu, Taoyuan City (TW); Hung-Chuan Lin, Taoyuan City (TW)

(73) Assignee: DELTA ELECTRONICS, INC., Taoyuan City (TW)

( * ) Notice: Subject to any disclaimer, the term of this patent is extended or adjusted under 35 U.S.C. 154(b) by 385 days.

(21) Appl. No.: 18/328,787

(22) Filed: Jun. 5, 2023

(65) Prior Publication Data

US 2024/0055998 A1 Feb. 15, 2024

(30) Foreign Application Priority Data

Aug. 11, 2022 (CN) ........................ 202210963275.X
Feb. 24, 2023 (CN) ........................ 202310161818.0

(51) Int. Cl.
*H02M 7/00* (2006.01)
*H05K 1/181* (2026.01)
*H05K 7/14* (2006.01)

(52) U.S. Cl.
CPC ............ *H02M 7/003* (2013.01); *H05K 1/181* (2013.01); *H05K 7/1427* (2013.01); *H05K 2201/10151* (2013.01)

(58) Field of Classification Search
CPC ............. H05K 1/18; H05K 1/181–187; H05K 2201/10151; H05K 7/1427; H02M 7/003;
(Continued)

(56) References Cited

U.S. PATENT DOCUMENTS 9,739,821 B2 8/2017 Krumpholz et al.
10,381,977 B2 * 8/2019 Har-Shai .............. H02H 1/0015
(Continued)

FOREIGN PATENT DOCUMENTS

CN 1128488 A 8/1996
CN 107728012 A 2/2018
(Continued)

OTHER PUBLICATIONS

Battuvshin Bayarkhuu et al., "Analog Basis, Low-Cost Inverter Output Current Sensing with Tiny PCB Coil Implemented inside IPM," 2019 31st International Symposium on Power Semiconductor Devices & ICs, Shanghai, China, 2019, pp. 251-254.
(Continued)

*Primary Examiner* — Tuan T Dinh
(74) *Attorney, Agent, or Firm* — CKC & Partners Co., LLC

(57) ABSTRACT

A photovoltaic inverter includes a casing, at least one circuit board located in the casing, a current sensor located on the at least one circuit board, an arc detector located on the at least one circuit board, a self-test coil located on the at least one circuit board, and at least one direct current input terminal located on the casing and connected to the at least one circuit board, wherein the self-test coil is configured to deliver a test signal to be sensed by the arc detector, and the direct current input terminal is configured to deliver a direct current through the arc detector, wherein the current sensor is configured to detect a magnitude of the direct current passing through the direct current input terminal.

18 Claims, 13 Drawing Sheets

(58) Field of Classification Search
CPC .. H02H 1/0015; G01R 31/142; G01R 31/152; G01R 15/181; G01R 35/00; H02S 40/00; H02S 40/32; H02S 40/34; H02S 50/10
USPC ............................ 361/91.1, 91.4, 91.6, 93.2
See application file for complete search history.

(56) References Cited

U.S. PATENT DOCUMENTS

| | | | | |
|---|---|---|---|---|
| 2004/0178875 | A1 | 9/2004 | Saito | |
| 2008/0121272 | A1* | 5/2008 | Besser | G05F 1/67 136/248 |
| 2012/0316804 | A1 | 12/2012 | Oberhauser | |
| 2014/0253109 | A1 | 9/2014 | Singh et al. | |
| 2014/0347069 | A1 | 11/2014 | Srdjan et al. | |
| 2016/0231375 | A1 | 8/2016 | Roemer et al. | |
| 2017/0054286 | A9 | 2/2017 | Haines et al. | |
| 2017/0278375 | A1* | 9/2017 | Galin | G08B 25/00 |
| 2017/0292999 | A1* | 10/2017 | Turner | G01R 31/62 |
| 2017/0356935 | A1 | 12/2017 | Hurwitz | |
| 2018/0048137 | A1 | 2/2018 | Macerini et al. | |
| 2018/0138723 | A1* | 5/2018 | Zhong | H02J 7/0013 |
| 2019/0079132 | A1 | 3/2019 | Chine et al. | |
| 2020/0052482 | A1* | 2/2020 | Ostrovsky | G08C 17/02 |
| 2020/0076364 | A1* | 3/2020 | Poyil | G01R 31/1227 |
| 2021/0167723 | A1* | 6/2021 | Yoscovich | H02S 50/00 |
| 2021/0194235 | A1 | 6/2021 | Koga et al. | |
| 2021/0288610 | A1 | 9/2021 | Yoscovich et al. | |
| 2021/0376595 | A1 | 12/2021 | Yoscovich et al. | |

FOREIGN PATENT DOCUMENTS

| | | | |
|---|---|---|---|
| CN | 110854104 | A | 2/2020 |
| CN | 111108569 | A | 5/2020 |
| CN | 111726079 | A | 9/2020 |
| CN | 111819748 | A | 10/2020 |
| CN | 215375643 | U | 12/2021 |
| CN | 114280440 | A | 4/2022 |
| CN | 114675101 | A | 6/2022 |
| CN | 114740251 | A | 7/2022 |
| CN | 114878996 | A | 8/2022 |
| EP | 2672282 | A1 | 12/2013 |
| JP | 2017529818 | A | 10/2017 |
| JP | 2018023268 | A | 2/2018 |
| JP | 2018117514 | A | 7/2018 |
| JP | 2020036511 | A | 3/2020 |
| JP | 2020076705 | A | 5/2020 |
| JP | 2021083296 | A | 5/2021 |
| KR | 102021927 | B1 | 9/2019 |
| TW | I537570 | B | 6/2016 |

OTHER PUBLICATIONS

M. Tsukuda et al., “Micro PCB Rogowski coil for current monitoring and protection of high voltage power modules,” Microelectronics Reliability, Sep. 1, 2016, pp. 479-483, vol. 64.

* cited by examiner

PHOTOVOLTAIC INVERTER

CROSS-REFERENCE TO RELATED APPLICATION

This application claims priority to China Application Serial Number 202210963275.X, filed Aug. 11, 2022, and China Application Serial Number 202310161818.0, filed Feb. 24, 2023, the entirety of which is incorporated by reference herein in their entireties.

BACKGROUND

Field of Disclosure

The present disclosure relates to a photovoltaic inverter.

Description of Related Art

In a photovoltaic power system, its photovoltaic panels are mounted outdoors, and then connected to photovoltaic inverters, batteries and other components through cables. Under the influence of an outdoor environment, the cables may be damaged, and electric arcing may occur and cause dangerous conditions when one of the cables is damaged.

SUMMARY

The present disclosure provides an improved photovoltaic inverter to deal with the needs of the prior art problems.

In one or more embodiments, a photovoltaic inverter includes a casing, at least one circuit board located in the casing, a current sensor located on the at least one circuit board, an arc detector located on the at least one circuit board, a self-test coil located on the at least one circuit board, and at least one direct current input terminal located on the casing and connected to the at least one circuit board, wherein the self-test coil is configured to deliver a test signal to be sensed by the arc detector, and the direct current input terminal is configured to deliver a direct current through the arc detector, wherein the current sensor is configured to detect a magnitude of the direct current passing through the direct current input terminal.

In one or more embodiments, a photovoltaic inverter includes a casing, at least one circuit board located in the casing, an arc detector located on the at least one circuit board, a self-test coil located on the at least one circuit board, and at least one direct current input terminal located on the casing and connected to the at least one circuit board, wherein the self-test coil is configured to deliver a test signal to be sensed by the arc detector, and the direct current input terminal is configured to deliver a direct current through the arc detector.

In sum, different from a conventional photovoltaic inverter with its arc detector wound around a ring frame, the photovoltaic inverter disclosed herein integrates the arc detector and self-test coil in the circuit board, which saves the cost and occupies less space, and the arc fault detection and self-function detection can be performed conveniently for each solar string.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
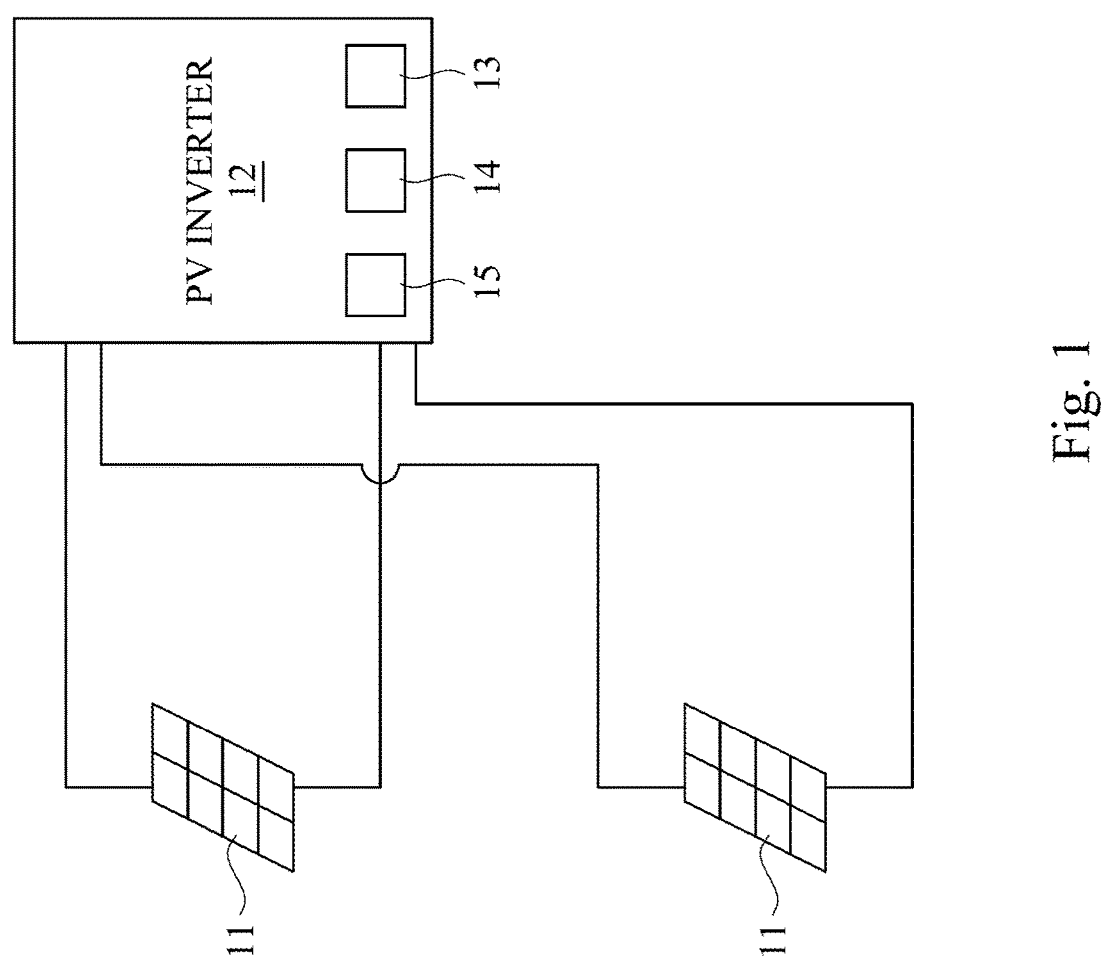
FIG. 1 illustrates a functional block diagram of a photovoltaic power system according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, a photovoltaic power system 10 includes a plurality of photovoltaic cells or panels 11 and a photovoltaic inverter 12. The photovoltaic inverter 12 is connected to the photovoltaic panels 11 and is configured to convert electric power (in direct current form) generated by the photovoltaic panels 11 into electric power (in alternating current form), and then output the electric power (in alternating current form) to a power grid or power consumption equipment. The photovoltaic inverter 12 includes an arc discharge controller 13, and the arc discharge controller 13 is configured to determine whether there is an electric arc discharge fault (hereinafter "arc fault") in an electric path between the photovoltaic inverter 12 and the photovoltaic panel 11. The photovoltaic inverter 12 also includes a direct current (DC) switch 14. When the arc discharge controller 13 determines that an arc fault occurs in an electric path between the photovoltaic inverter 12 and the photovoltaic panel 11, the DC switch 14 is configured to cut off the electric power supplied by the photovoltaic panel 11 to the photovoltaic inverter 12. The photovoltaic inverter 12 also includes a self-test circuit controller 15. The self-test circuit controller 15 is configured to inject a white noise or a high-frequency signal through the self-test coil (e.g., a self-test coil 38 in FIG. 2) to detect whether the arc discharge controller 13 and/or an arc detector (e.g., arc detector 35 in FIG. 2) is functioning normally.

In particular, the photovoltaic inverter 12 may stop receiving energy from the photovoltaic panel 11 when the arc discharge controller 13 determines that an arc fault occurs in the electric path between the photovoltaic inverter 12 and the photovoltaic panel 11 (i.e., the photovoltaic inverter 12 can be closed and stopped operating, or cutting off the power supply of the photovoltaic panel 11 to the photovoltaic inverter 12 by means of the DC switch 14). Because the photovoltaic panel 11 is a passive component, it will generate electricity when it is irradiated by sunlight, unlike other DC power supplies such as power supplies and batteries, which can be turned off when abnormalities are detected. Therefore, the arc fault detecting function is integrated in the photovoltaic inverter 12 of the photovoltaic power system 10, and used to cut off the power (stops drawing current from the photovoltaic panel 11) to protect the photovoltaic power system 10 when the arc fault occurs.

Figure 2:
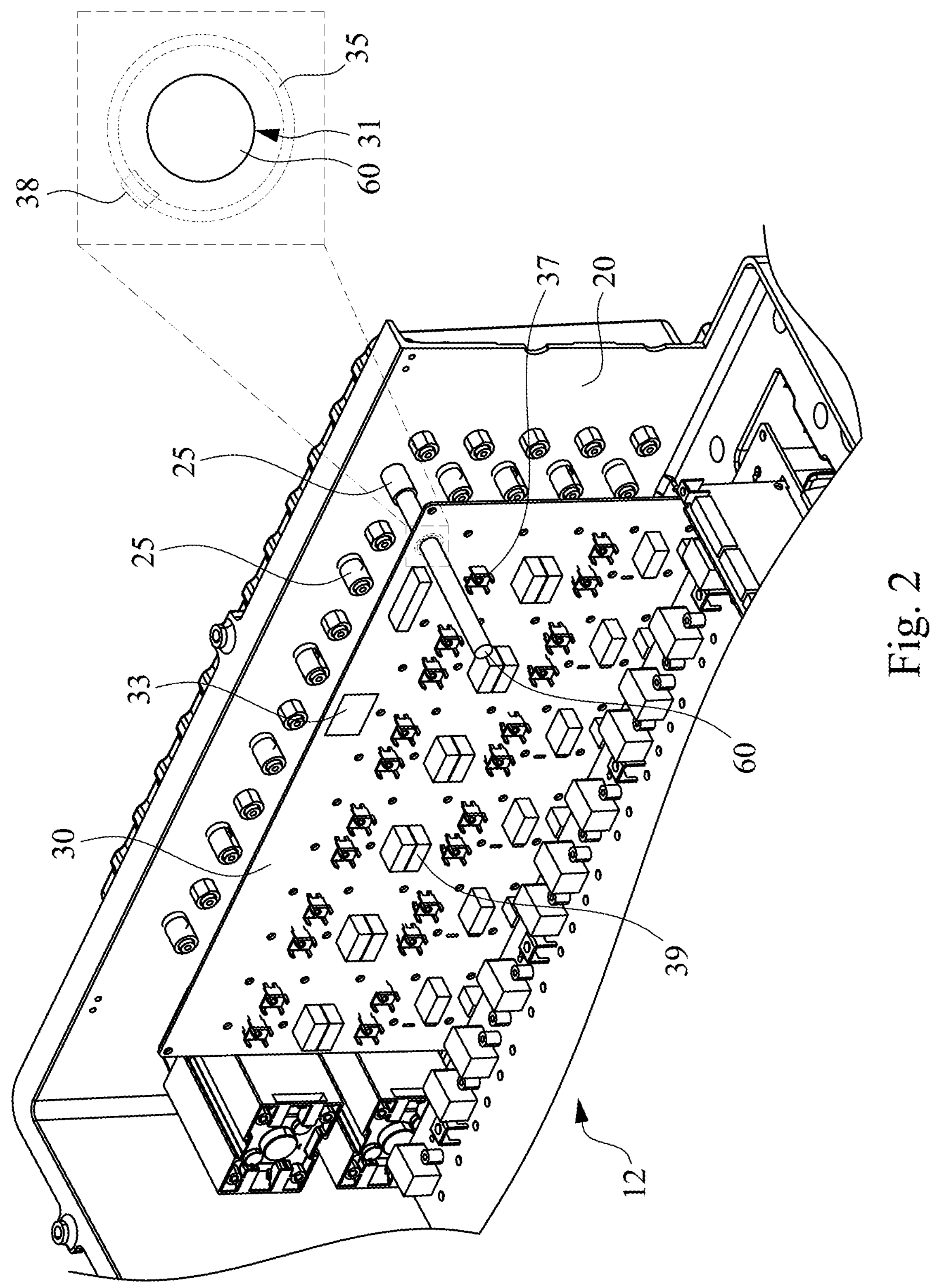
FIG. 2 illustrates a perspective view showing an internal structure of a photovoltaic inverter according to an embodiment of the present disclosure.

Reference is made to FIG. 2, the photovoltaic inverter 12 includes a casing 20 and one or more direct current input terminals 25. Each direct current input terminal 25 is arranged on a wall of the casing 20, and is connected to the photovoltaic panel 11 (referring to FIG. 1) to receive electric currents from the photovoltaic panel 11. In some embodiments, each direct current input terminal 25 is connected to a solar string that includes one or more photovoltaic panels 11.

Referring to FIG. 2, the photovoltaic inverter 12 may include a circuit board 30, and the circuit board 30 is located within the casing 20 and faces the direct current input terminal 25 and connected to the direct current input terminal 25. In this embodiment, the direct current input terminal 25 is connected to the circuit board 30 via an electrical cable 60. Specifically, the circuit board 30 has a through hole or opening 31, one end of the electrical cable 60 is connected to the direct current input terminal 25, and extends through or across the circuit board 30 via the opening 31. In some embodiments, the electrical cable 60 passes through the circuit board 30 to be connected to a connection interface (e.g., connection terminal 37) on the circuit board 30.

Referring to FIG. 2, the photovoltaic inverter 12 may further include a current sensor 33 located on the circuit board 30 (only for illustration, no specific structure is drawn), and the current sensor 33 is configured to detect a magnitude of the current passing through the direct current input terminal 25. In other words, the circuit board 30 has the function of detecting an input current flowing through the direct current input terminal 25.

Referring to FIG. 2, the photovoltaic inverter 12 may further include an arc detector 35. The arc detector 35 is an electric arc discharge detection coil designed on the circuit board 30, and is arranged around the opening 31 of the circuit board 30. Therefore, the direct current input terminal 25 can deliver current through a central void, i.e., the opening 31, of the arc detector 35 via the electrical cable 60. In some embodiments, the arc detector 35 may be located on a surface of the circuit board 30. In other embodiments, the arc detector 35 may also be embedded in the circuit board 30. The photovoltaic inverter 12 also includes a self-test coil 38, and the self-test coil 38 is also embedded in the circuit board 30, and is positioned on a segment of the arc detector 35. The self-test coil 38 injects a white noise or high frequency signal to test whether or not the arc detector 35 can detect the white noise or high frequency signal.

The arc detector 35 can be a Rogowski coil. The arc detector 35 can be connected to an (electric) arc discharge controller 13 through a signal line (referring to FIG. 1). The arc discharge controller 13 can be located on the circuit board 30, or on other circuit board. The arc discharge controller 13 is used to receive a signal (e.g., voltage signal) from the arc detector 35, and the received signal is then processed and spectrum analyzed to determine whether the arc fault occurs at the solar string that corresponds to the direct current input terminal 25. Fault. The arc discharge controller 13 may contain filters, amplifiers, digital signal processors or other electronic components to perform spectral analysis such as filtering, amplification and Fourier analysis, and determine whether an arc failure occurs.

In the current practice of the photovoltaic inverter, a conventional arc detector is wound around a ring frame (core) for arc fault detection, and the self-test coil 38 is wound around a segment of the ring frame. However, this type of arc detector occupies a large volume, and the wiring of the self-test coil 38 is also messy, and the cost is high. The photovoltaic inverter 12 disclosed herein integrates both the arc detector 35 and the self-test coil 38 on the circuit board 30 that can save the assembly space and cost of the arc detector and the self-test coil. It is only necessary to arrange the arc detector 35 around the direct current input terminal 25 on the circuit board 30 to perform arc detection independently for the corresponding solar string.

Further, the embodiment shown in FIG. 2 integrates the arc detector 35 and the self-test coil 38 into the original circuit board 30 equipped with current detection function and used to the direct current input terminal 25, thereby making the structure of the photovoltaic inverter 12 more compact.

It is noted that FIG. 2 only illustrates one of the direct current input terminals 25 connected to the circuit board 30 through the electrical cable 60, and the arc detector 35 and self-test coil 38 matching with a corresponding to one of the direct current input terminals 25. In actual products, each direct current input terminal 25 of the photovoltaic inverter 12 can be connected to an electrical cable 60, and a plurality of arc detectors 35 can be arranged on the circuit board 30, and each arc detector 35 can be sleeved on one of the direct current input terminals 25, i.e., to surround one of the electrical cables 60, and a self-test coil 38 is arranged to surround a segment of the arc detector 35.

In some embodiments, the circuit board 30 is a bus circuit board. Specifically, the circuit board 30 is configured to receive currents from a plurality of direct current input terminals 25, and output current via at least one output terminal (e.g., a connection terminal 37) on the circuit board 30, wherein a number (or quantity) of output terminals is less than a number (or quantity) of the direct current input terminals 25. Therefore, in these embodiments, the arc detector 35 and the self-test coil 38 are integrated on the original bus circuit board such that the photovoltaic inverter 12 can have a compact structure.

In some embodiments, the photovoltaic inverter 12 further includes an e electromagnetic interference suppressing capacitor 39 located on the circuit board 30. Therefore, in these embodiments, the arc detector 35 is integrated on the original circuit board 30 which matches with the direct current input terminal 25 and has the function of suppressing electromagnetic interference such that the photovoltaic inverter 12 can have a compact structure.

Figure 3:
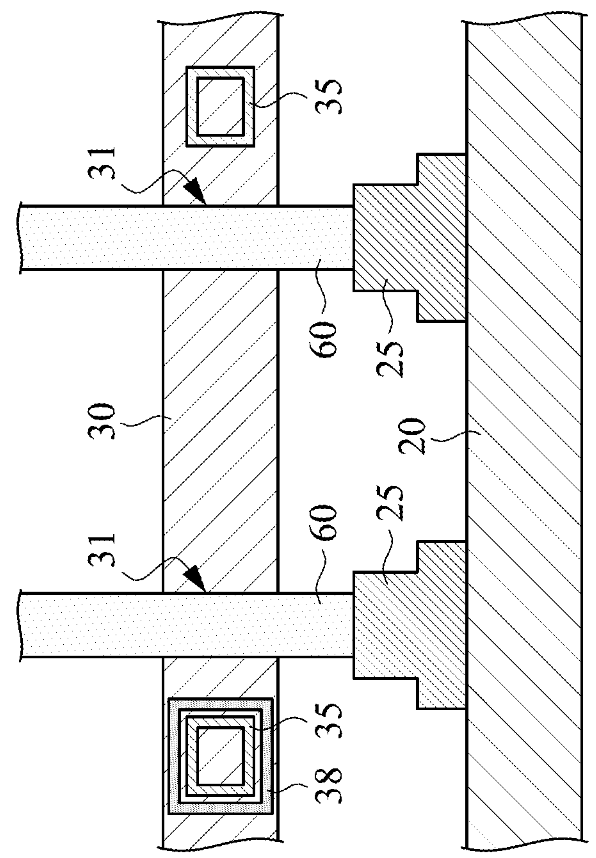
FIG. 3 illustrates a partial enlarged section view of a photovoltaic inverter according to another embodiment of the present disclosure.

Reference is made to FIG. 3. Different from the foregoing embodiments, two or more direct current input terminals 25 share one arc detector 35 in this embodiment. Specifically, the circuit board 30 has multiple openings 31, each opening 31 allows an electrical cable 60 to be passed through, and each electrical cable 60 is connected to a different direct current input terminal 25. The arc detector 35 is arranged around the multiple openings 31 such that multiple direct current input terminals 25 transmit current through the arc detector 35 via their corresponding electrical cables 60. The arc detector 35 can be connected to the arc discharge controller through a signal line, and the arc discharge controller is configured to receive signals from the arc detector 35, and perform signal processing and spectrum analysis on the received signals to determine whether there is any arc fault occurring in the solar string group corresponding to a direct current input terminal 25. A self-test coil 38 may be arranged to surround a segment of the arc detector 35 to provide a self-test function for the arc detector 35 and the arc discharge controller.

Figure 4:
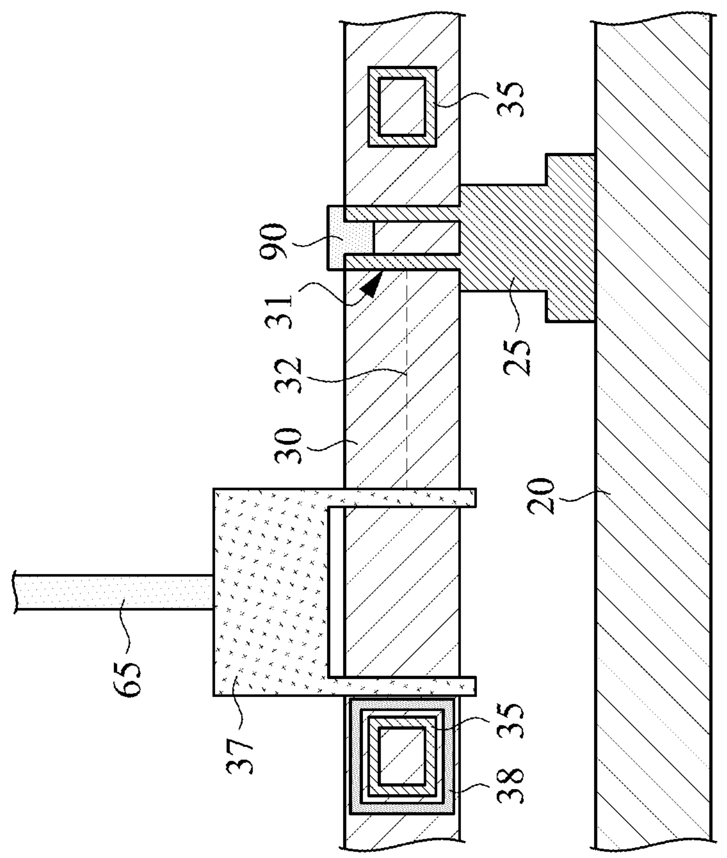
FIG. 4 illustrates a partial enlarged section view of a photovoltaic inverter according to still another embodiment of the present disclosure.
Figure 5:
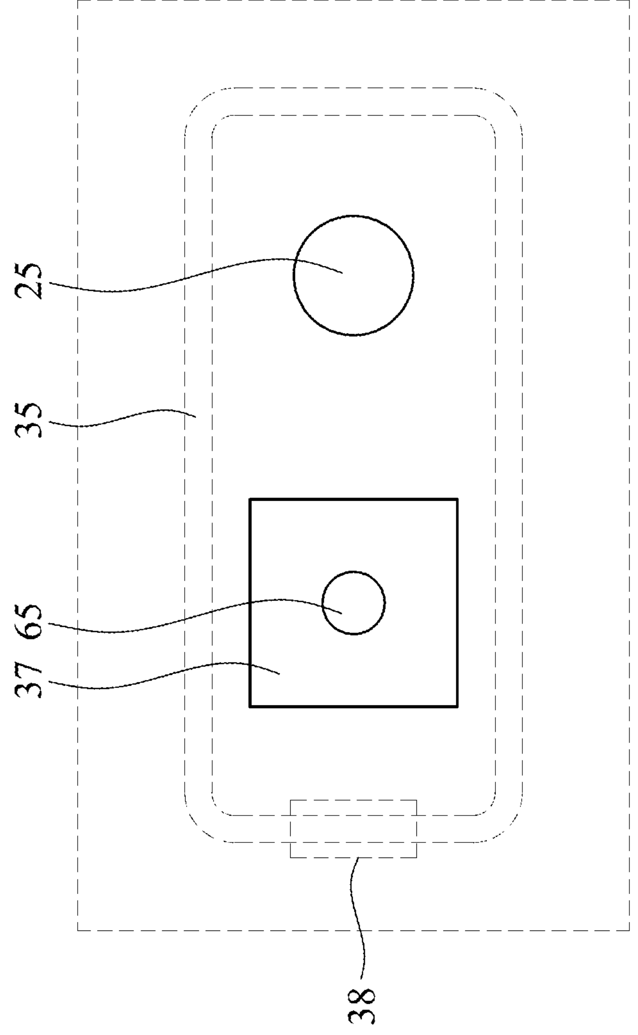
FIG. 5 illustrates a front view of the photovoltaic inverter in FIG. 4.

Reference is made to FIGS. 4 and 5. Different from the foregoing embodiment of using the electrical cable 60 to connect the direct current input terminal 25, the circuit board 30 is fixed on the direct current input terminal 25 directly (i.e., without electrical cable) in this embodiment. In some embodiments, the direct current input terminal 25 is inserted into the opening 31 of the circuit board 30, and an end of the direct current input terminal 25 is secured with a fastener 90 (such as a screw), thereby locking and fixing the circuit board 30 on the direct current input terminal 25.

As illustrated in FIGS. 4 and 5, the photovoltaic inverter 12 further includes a connection terminal 37. The connection terminal 37 is located on the circuit board 30 and is electrically connected to the direct current input terminal 25 through an internal circuit route 32 (indicated by a dotted line) of the circuit board 30. Therefore, the current flows through the direct current input terminal 25, the internal circuit route 32 of the circuit board 30, and the connection terminal 37 in sequence. The connection terminal 37 can be externally connected to an electrical cable 65 to deliver current to other components of the photovoltaic inverter 12, e.g., a DC switch. The arc detector 35 is arranged around the direct current input terminal 25 and the connection terminal 37, so that the current from the direct current input terminal 25 passes through the arc detector 35. Some segment of the arc detector 35 are also provided with a self-test coil 38 to provide a self-test function for the arc detector 35 and the arc discharge controller. In some embodiments, a helical coil formed by the arc detector 35 on the circuit board defines a closed (loop) rectangular ring, and the self-test coil 38 is arranged at a partial section of the closed ring. In some embodiments, the closed ring shape of the arc detector 35 can also be circular, elliptical, square or triangular. In some other embodiments, the helical coil formed by the arc detector 35 on the circuit board may also be an unclosed (or open-loop) rectangular ring, circular ring, elliptical ring, square ring or triangular ring.

Figure 6:
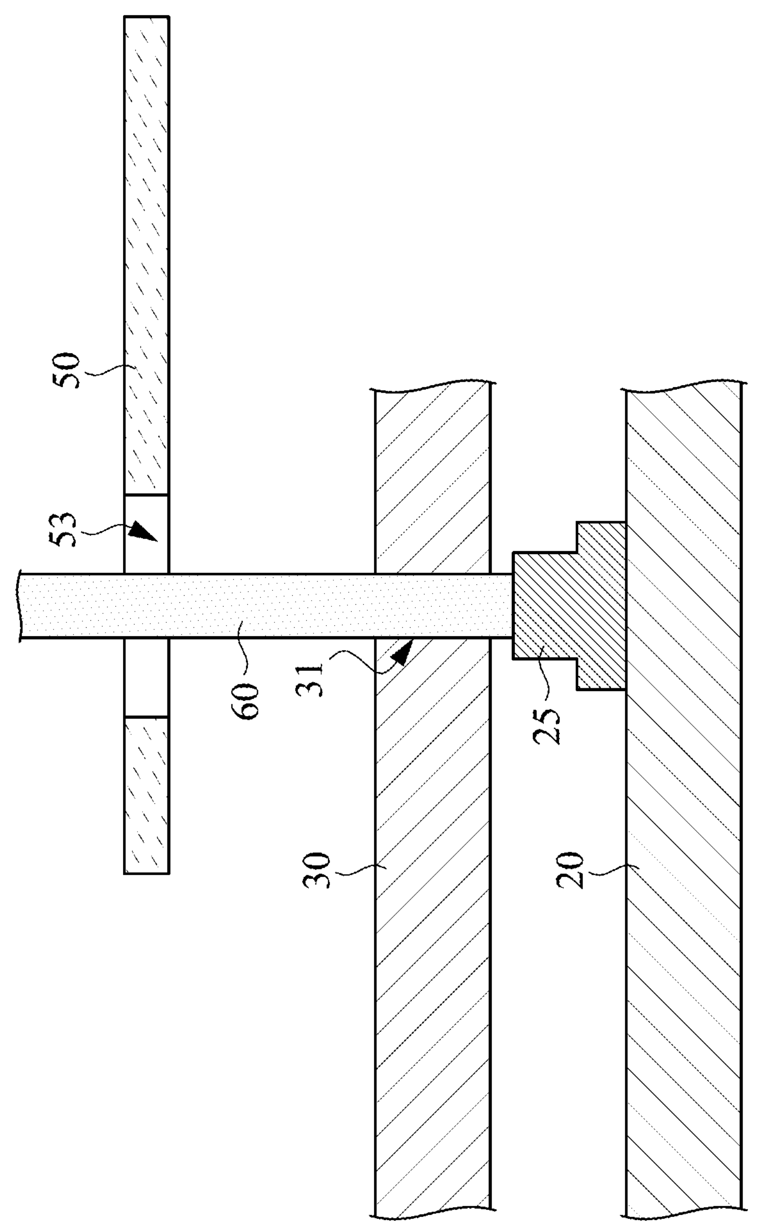
FIG. 6 illustrates a partial enlarged section view of a photovoltaic inverter according to still another embodiment of the present disclosure.
Figure 7:
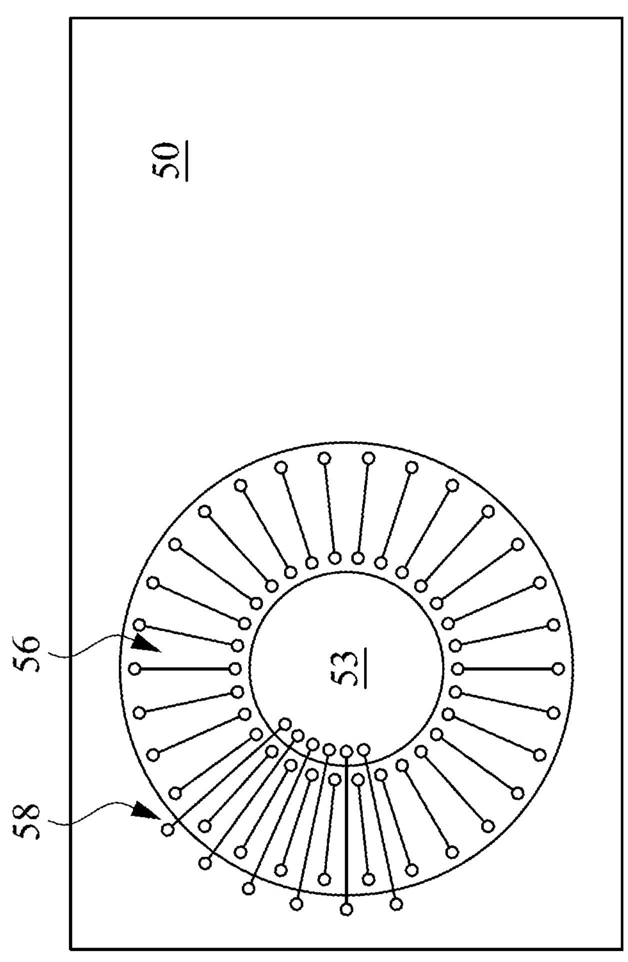
FIG. 7 illustrates a front view of a second circuit board in FIG. 6.

Reference is made to FIGS. 6 and 7. The difference between this embodiment and the embodiment in FIG. 2 lies in that the arc detector and the current sensor are located on different circuit boards. Specifically, in this embodiment, the current sensor is located on the circuit board 30 (see FIG. 2), the photovoltaic inverter further includes a circuit board 50, and an arc detector 56 and its self-test coil 58 are located on the circuit board 50. The circuit board 50 has an opening 53, and the arc detector 56 is arranged around the opening 53. The circuit board 50 is sleeved on the electrical cable 60 and connected to the direct current input terminal 25. In other words, the electrical cable 60 passes through the opening 53 of the circuit board 50, so that the arc detector 56 surrounds the electrical cable 60. Therefore, the current from the direct current input terminal 25 passes through the arc detector 56 via the electrical cable 60. A segment of the arc detector 56 is provided with a self-test coil 58 to perform a self-test function for the arc detector 56 and the arc discharge controller.

Figure 8:
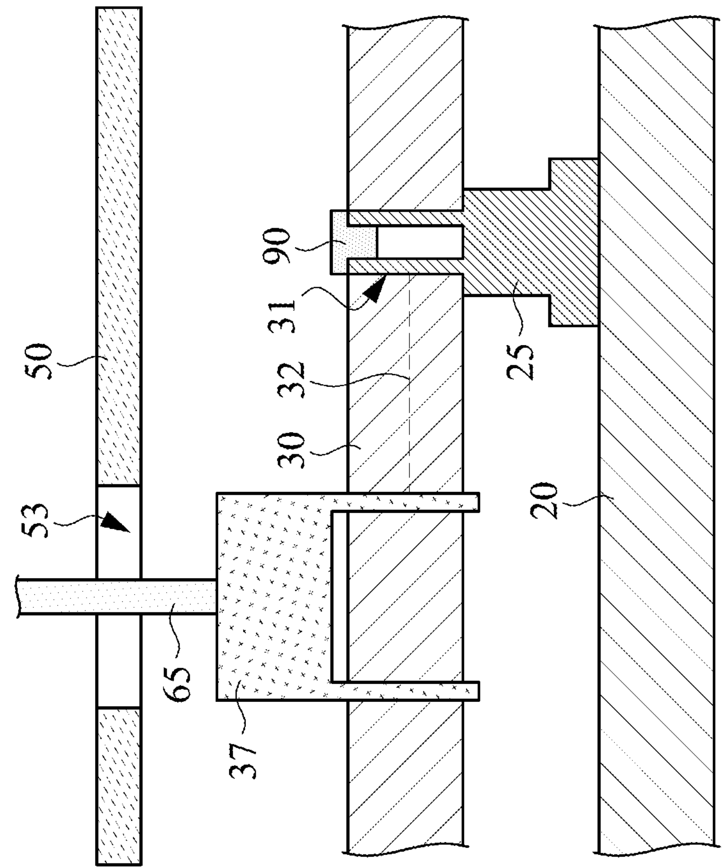
FIG. 8 illustrates a partial enlarged section view of a photovoltaic inverter according to still another embodiment of the present disclosure.

Reference is made to FIGS. 7 and 8. The difference between this embodiment and the embodiment in FIG. 4 lies in that the arc detector and the current sensor are located on different circuit boards. Specifically, in this embodiment, the current sensor is located on the circuit board 30 (see FIG. 2), the photovoltaic inverter further includes a circuit board 50, and the arc detector 56 is located on the circuit board 50. The circuit board 50 has an opening 53, and an arc detector 56 is arranged around the opening 53. The circuit board 50 is sleeved on the electrical cable 65 and connected to the connection terminal 37 on the circuit board 30. In other words, the electrical cable 65 passes through the opening 53 of the circuit board 50, so that the arc detector 56 surrounds the electrical cable 65. Therefore, the current from the direct current input terminal 25 passes through the arc detector 56 via the electrical cable 65.

Figure 9:
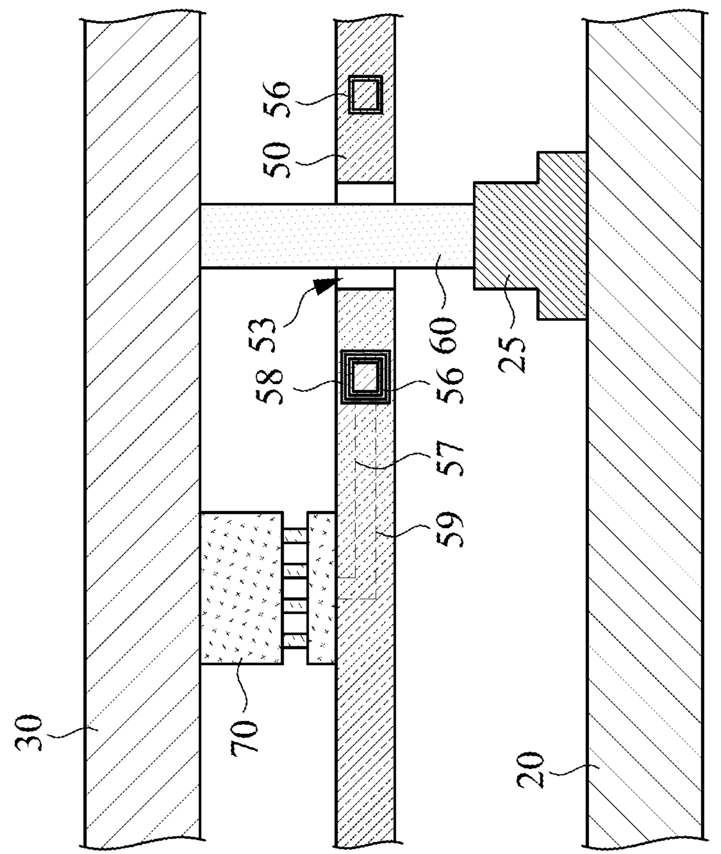
FIG. 9 illustrates a partial enlarged section view of a photovoltaic inverter according to still another embodiment of the present disclosure.

Reference is made to FIG. 9. In this embodiment, the current sensor (see FIG. 2), the arc detector 56, and the self-test coil 58 are located on the circuit boards 30 and 50 respectively, and the circuit board 50 is located between the circuit board 30 and the direct current input terminal 25. The direct current input terminal 25 is connected to the circuit board 30 through the electrical cable 60. Specifically, one end of the electrical cable 60 is fixedly connected to the direct current input terminal 25 and extends through the opening 53 of the circuit board 50, and the other end is fixedly connected to the circuit board 30. The photovoltaic inverter further includes an electrical connector 70 which has a male component (e.g., a plug) and a female component (e.g., a socket) that engage each other. The electrical connector 70 is connected between the circuit boards 30 and 50, and is electrically connected to the arc detector 56 arranged around the opening 53 via an internal circuit route 57 of the circuit board 50. The electrical connector 70 can include a plurality of pins, and the sensing signal generated by the arc detector 56 can be transmitted to the circuit board 30 through the internal circuit route 57 of the circuit board 50 and the electrical connector 70.

In some embodiments, the arc discharge controller may be arranged on the circuit board 30, and the sensing signal generated by the arc detector 56 is transmitted to the arc discharge controller on the circuit board 30 through the electric connector 70 to be analyzed. In other embodiments, the arc discharge controller may be located on other circuit boards, and the sensing signal generated by the arc detector 56 is first transmitted to the circuit board 30 through the electrical connector 70, and then transmitted to the arc discharge controller on other circuit boards through other routes to be analyzed. In some embodiments, a self-test circuit controller, e.g., self-test circuit controller 15 in FIG. 1, may be located on the circuit board 30, and the self-test circuit controller transmits a white noise or high frequency signal to the self-test coil 58 through the electrical connector 70 and an internal circuit route 59 of the circuit board 50. The white noise or high frequency signal is injected by means of the self-test coil 58 to provide a self-test function for the arc detector 56 and the arc discharge controller.

Figure 10:
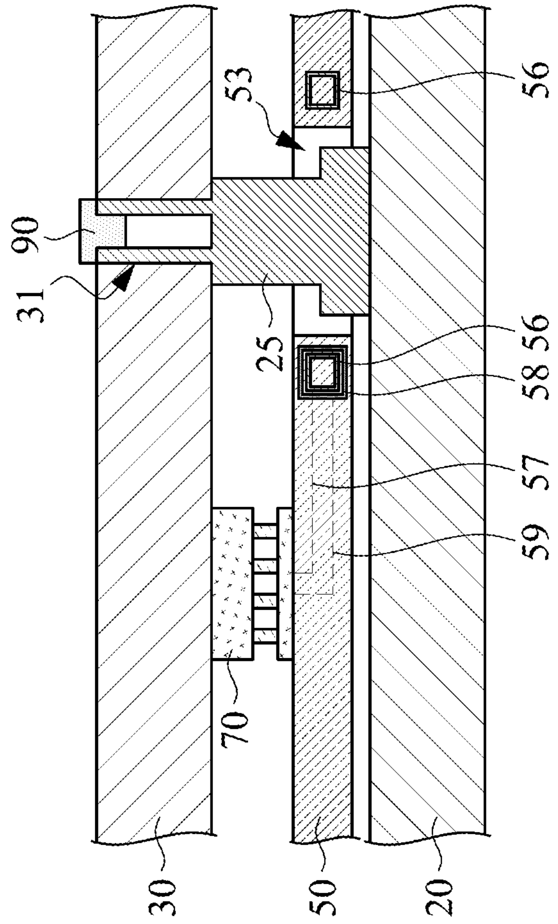
FIG. 10 illustrates a partial enlarged section view of a photovoltaic inverter according to still another embodiment of the present disclosure.

Reference is made to FIG. 10. Different from the embodiment in FIG. 9, in this embodiment, the circuit board 30 is fixed on the direct current input terminal 25, e.g., fixed by a fastener 90 such as screws, and the circuit board 50 is located between the circuit board 30 and a wall surface of the casing 20 on which the direct current input terminal 25 is mounted. The circuit board 50 is sleeved on the direct current input terminal 25 (i.e., the direct current input terminal 25 extends through the opening 53 of the circuit board 50). The circuit boards 30 and 50 are connected through an electrical connector 70, and the electrical connector 70 is electrically connected to the arc detector 56 arranged around the opening 53 through an internal circuit route 57 of the circuit board 50. A segment of the arc detector 56 is provided with a self-test coil 58 to perform a self-test function for the arc detector 56 and the arc discharge controller.

Figure 11:
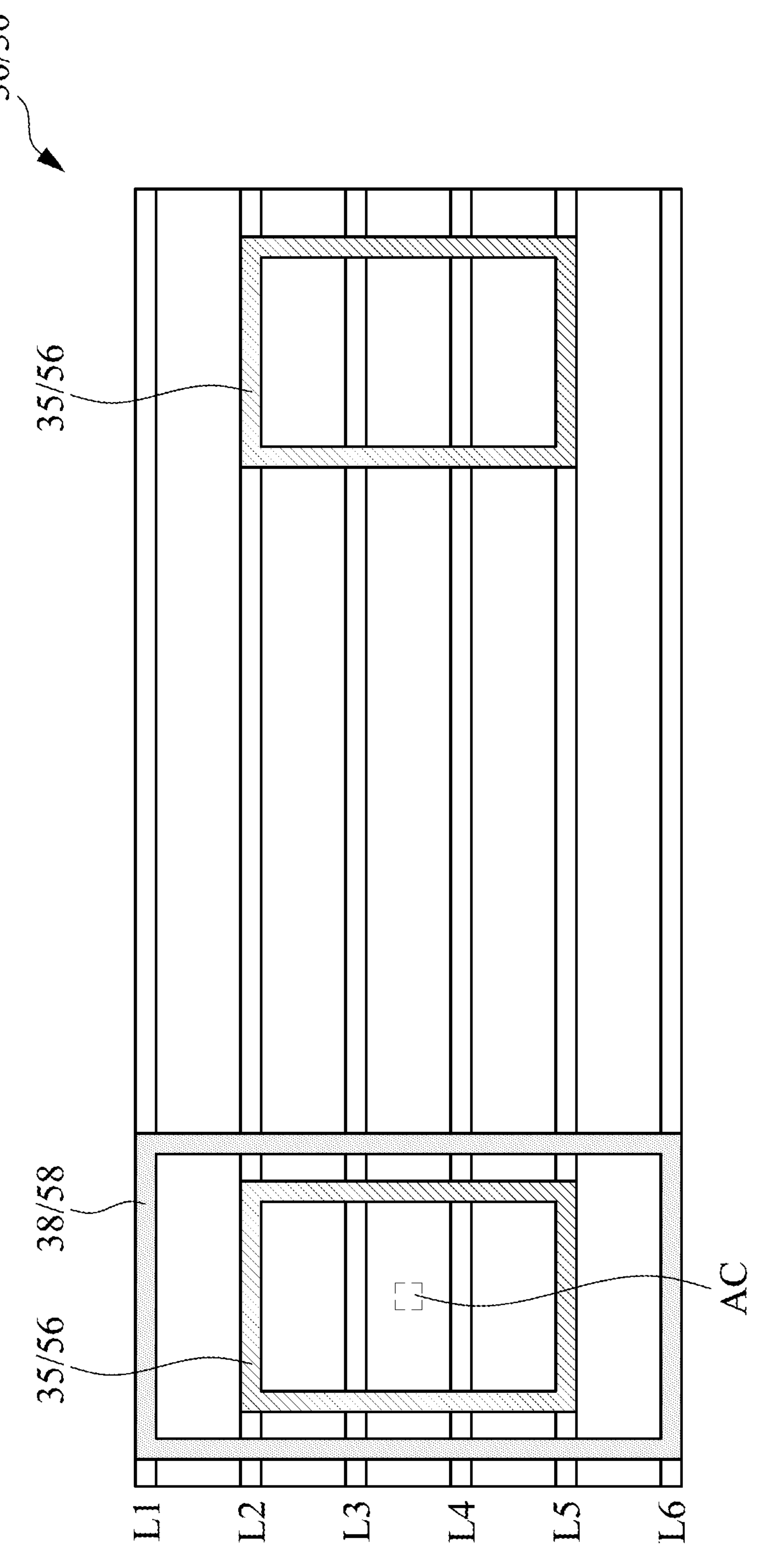
FIG. 11 illustrates a partial enlarged section view of a circuit board according to an embodiment of the present disclosure.

Reference is made to FIG. 11, which illustrates a partial enlarged section view of a circuit board (30/50) according to an embodiment of the present disclosure. This figure shows a cross-sectional view of a 6-layer (L1~L6) copper foil circuit boards (30/50), which partially includes the aforementioned arc detector (35/56) and self-test coil (38/58). In this embodiment, the arc detector (35/56) is formed between layer L2 to layer L5 to form a helical coil, and the self-test coil (38/58) is formed between layer L1 to layer L6 to form another helical coil that is wrapped around a segment of the arc detector (35/56). In this embodiment, the helical coil of the arc detector (35/56) and the helical coil of the self-test coil (38/58) are coaxial, i.e., the air core AC serves as the axis. The self-test coil (38/58) is configured to inject a white noise or high-frequency signal into an air core AC to test whether the arc detector (35/56) can detect the white noise or high-frequency signal in the air core AC, to provide a self-detection function for the arc detector and arc discharge controller.

Figure 12:
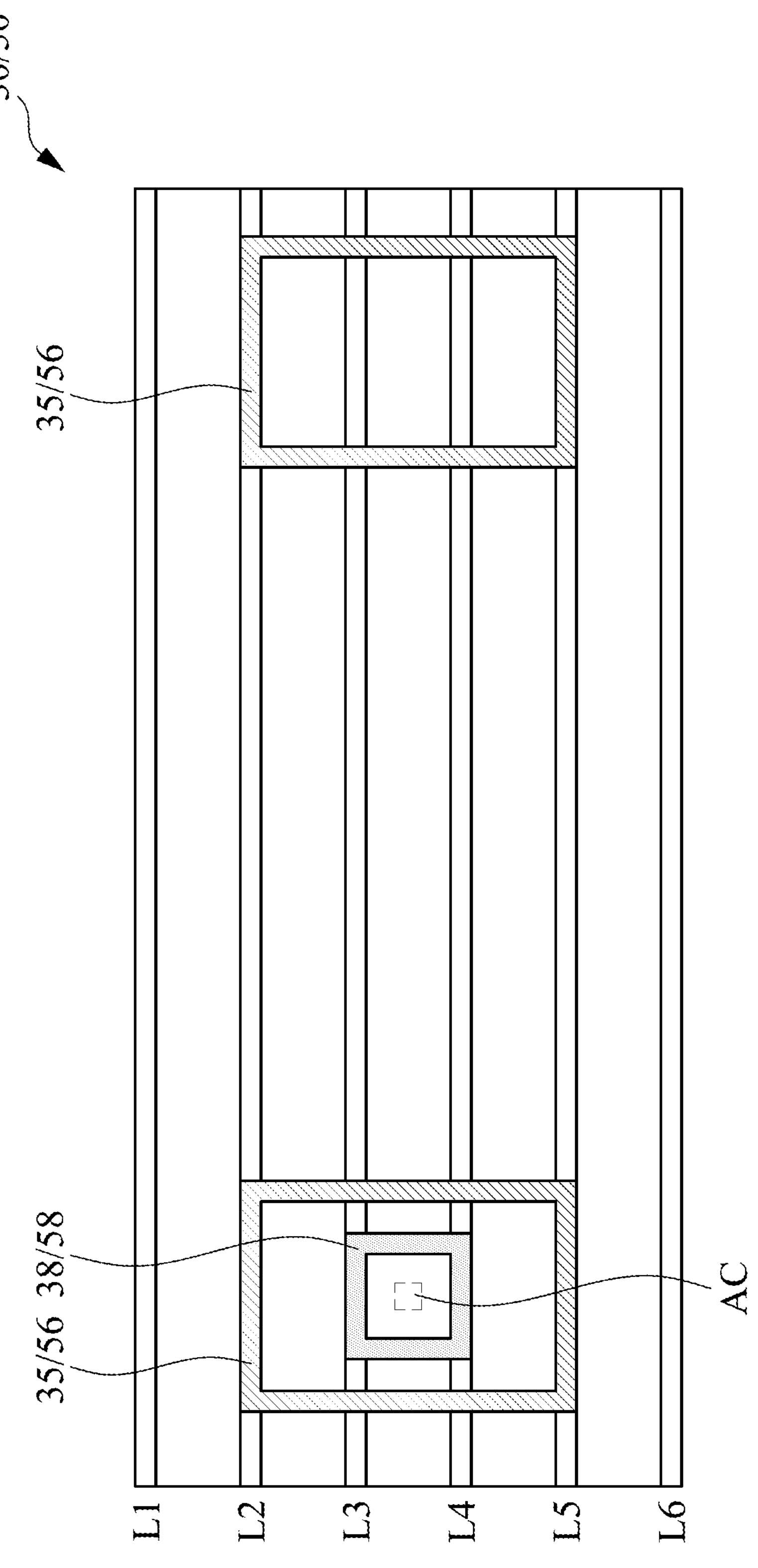
FIG. 12 illustrates a partial enlarged section view of a circuit board according to another embodiment of the present disclosure.

Reference is made to FIG. 12, which illustrates a partial enlarged section view of a circuit board (30/50) according to another embodiment of the present disclosure. Different from the embodiment shown in FIG. 11, in this embodiment, the arc detector (35/56) is formed between layer L2 to layer L5 to form a helical coil, and the self-test coil (38/58) is formed between layer L3 and layer L4 to form a helical coil and be located in an inner circle of a partial section of the arc detector. In this embodiment, the helical coil of the arc detector (35/56) and the helical coils of the self-test coil (38/58) are coaxial, e.g., using the air core AC as the axis. The self-test coil (38/58) is configured to inject a white noise or high-frequency signal into an air core AC to test whether the arc detector (35/56) can detect the white noise or high-frequency signal in the air core AC, to provide a self-detection function for the arc detector and arc discharge controller.

Figure 13:
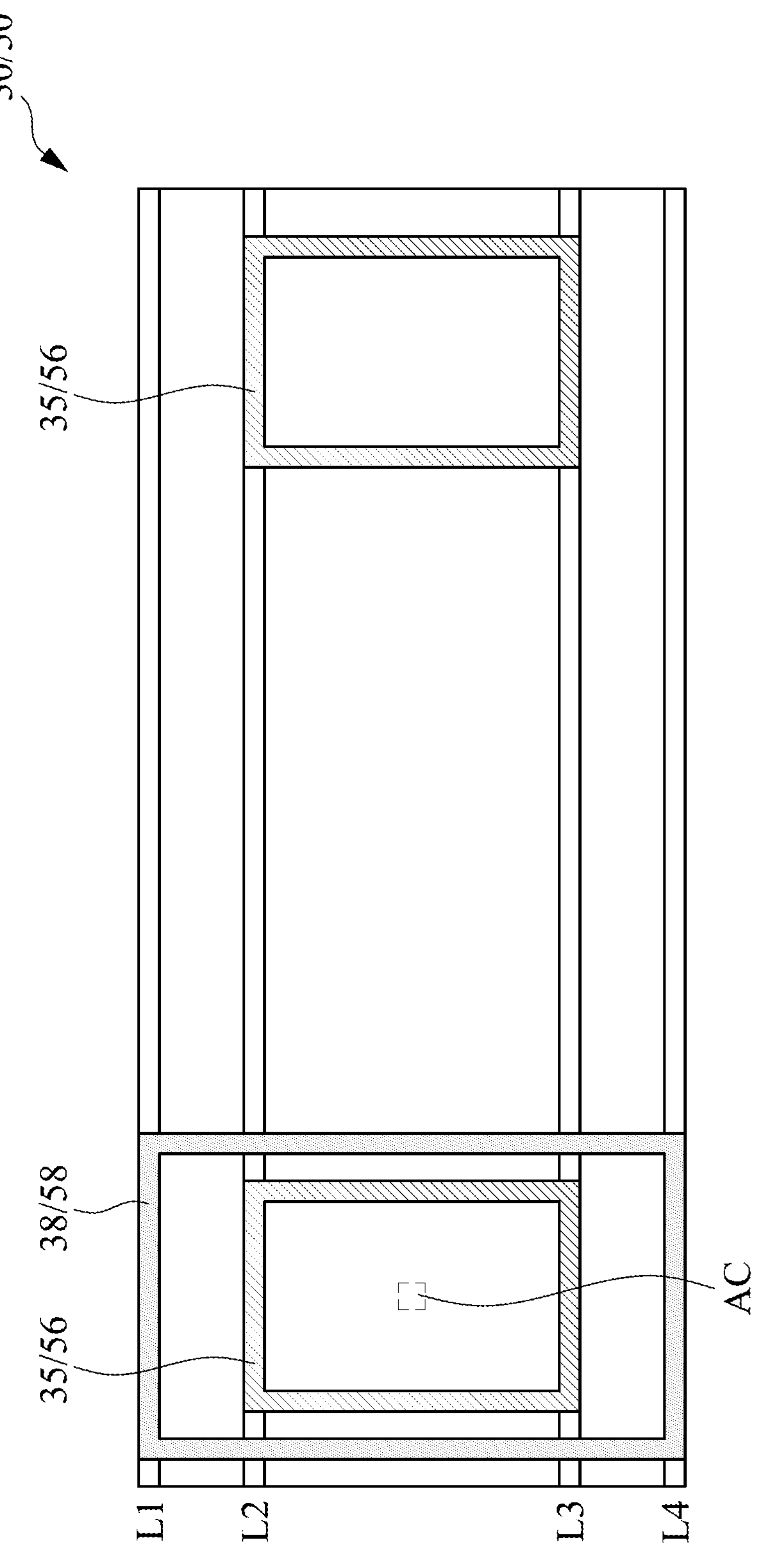
FIG. 13 illustrates a partial enlarged section view of a circuit board according to still another embodiment of the present disclosure.

Reference is made to FIG. 13, which illustrates a partial enlarged section view of a circuit board (30/50) according to still another embodiment of the present disclosure. Different from the embodiments shown in FIGS. 11 and 12, in this embodiment, the circuit board (30/50) is only a circuit board with 4 layers (L1-L4) of copper foil. The arc detector (35/56) is formed between layer L2 to layer L3 to form a helical coil, the self-test coil (38/58) is formed between layer L1 to layer L4 to form another helical coil that surrounds a partial section of the helical coil of the arc detector (35/56). In other embodiments, similar to the embodiment of FIG. 12, the arc detector (35/56) can be formed between layers L1 to L4 to form a helical coil, and the self-test coil (38/58) can be formed between layers L2 to L3 to form another helical coil and located in in an inner circle of a partial section of the helical coil of the arc detector (35/56).

In sum, different from a conventional photovoltaic inverter with its arc detector wound around a ring frame, the photovoltaic inverter disclosed herein integrates the arc detector and self-test coil in the circuit board, which saves the cost and occupies less space, and the arc fault detection and self-function detection can be performed conveniently for each solar string.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A photovoltaic inverter comprising:

a casing;

at least one circuit board disposed in the casing;

a current sensor disposed on the at least one circuit board;

an arc detector disposed on the at least one circuit board;

a self-test coil disposed on the at least one circuit board;

at least one direct current input terminal disposed on the casing and connected to the at least one circuit board, wherein the self-test coil is configured to deliver a test signal to be sensed by the arc detector, and the direct current input terminal is configured to deliver a direct current through the arc detector, wherein the current sensor is configured to detect a magnitude of the direct current passing through the direct current input terminal; and a first helical coil formed by the arc detector and a second helical coil formed by the self-test coil in the at least one circuit board are coaxial.

2. The photovoltaic inverter of claim 1, wherein the at least one circuit board comprises a first circuit board, wherein the current sensor, the self-test coil and the arc detector are all disposed on the first circuit board.

3. The photovoltaic inverter of claim 1, wherein the at least one circuit board comprises a first circuit board and a second circuit board, the current sensor is disposed on the first circuit board, the arc detector and the self-test coil are disposed on the second circuit board, the self-test coil is disposed at a segment of the arc detector.

4. The photovoltaic inverter of claim 1, wherein the direct current input terminal is configured to be connected to a photovoltaic panel, the photovoltaic inverter further comprises an arc discharge controller configured to receive a signal from the arc detector, and further configured to determine whether an electric arc discharge fault occurs on an electrical path between the photovoltaic inverter and the photovoltaic panel based on the signal, wherein the photovoltaic inverter is configured to stop receiving energy from the photovoltaic panel when the electric arc discharge fault occurs.

5. The photovoltaic inverter of claim 1, wherein the first helical coil formed by the arc detector in the at least one circuit board defines a ring-shape, and the self-test coil is disposed at a segment of the ring-shape.

6. The photovoltaic inverter of claim 2, further comprising an electrical cable that is connected to the direct current input terminal, wherein the first circuit board has an opening, the electrical cable extends through the opening, the arc detector is arranged around the opening, and the self-test coil is disposed at a segment of the arc detector.

7. The photovoltaic inverter of claim 2, further comprising a connection terminal, wherein the first circuit board is fixed on the direct current input terminal, the connection terminal is arranged on the first circuit board, and is electrically connected to the direct current input terminal through an internal circuit of the first circuit board, the arc detector is disposed to surround the direct current input terminal and the connection terminal.

8. The photovoltaic inverter of claim 2, wherein the at least one direct current input terminal comprises a plurality of direct current input terminals, the first circuit board is configured to receive currents from the plurality of direct current input terminals, and configured to output currents through at least one output terminal, wherein a number of the at least one output terminal is smaller than a number of the plurality of direct current input terminals.

9. The photovoltaic inverter of claim 2, further comprising an electromagnetic interference suppressing capacitor disposed on the first circuit board.

10. The photovoltaic inverter of claim 3, further comprising an electrical cable that is connected to the direct current input terminal and extends through the first circuit board, wherein the second circuit board is sleeved on the electrical cable.

11. The photovoltaic inverter of claim 3, further comprising a connection terminal and an electrical cable, wherein the first circuit board is fixed on the direct current input terminal, the connection terminal is arranged on the first circuit board, and is electrically connected to the direct current input terminal through an internal circuit of the first circuit board, the electrical cable is connected to the connecting terminal, and the second circuit board is sleeved on the electrical cable.

12. The photovoltaic inverter of claim 3, further comprising an electrical cable and an electrical connector, the electrical cable is connected between the direct current input terminal and the first circuit board, and passes through the second circuit board, the electrical connector is connected between the first circuit board and the second circuit board, and further electrically connected to the arc detector through an internal circuit of the second circuit board.

13. The photovoltaic inverter of claim 3, wherein the first circuit board is fixed on the direct current input terminal, the second circuit board is located between the first circuit board and a wall surface of the casing, and is sleeved on the direct current input terminal, and the photovoltaic inverter further comprises an electrical connector that is connected between the first circuit board and the second circuit board, and is electrically connected to the arc detector through an internal circuit of the second circuit board.

14. A photovoltaic inverter comprising:

a casing;

at least one circuit board disposed in the casing;

an arc detector disposed on the at least one circuit board;

a self-test coil disposed on the at least one circuit board;

at least one direct current input terminal disposed on the casing and connected to the at least one circuit board, wherein the self-test coil is configured to deliver a test signal to be sensed by the arc detector, and the direct current input terminal is configured to deliver a direct current through the arc detector; and a first helical coil formed by the arc detector and a second helical coil formed by the self-test coil in the at least one circuit board are coaxial.

15. The photovoltaic inverter of claim 14, wherein the at least one circuit board comprises a first circuit board, wherein the self-test coil and the arc detector are both disposed on the first circuit board.

16. The photovoltaic inverter of claim 15, further comprising an electrical cable that is connected to the direct current input terminal, wherein the first circuit board has an opening, the electrical cable extends through the opening, the arc detector is arranged around the opening, and the self-test coil is disposed at a segment of the arc detector.

17. The photovoltaic inverter of claim 15, further comprising a connection terminal, wherein the first circuit board is fixed on the direct current input terminal, the connection terminal is arranged on the first circuit board, and is electrically connected to the direct current input terminal through an internal circuit of the first circuit board, the arc detector is disposed to surround the direct current input terminal and the connection terminal.

18. The photovoltaic inverter of claim 15, wherein the at least one direct current input terminal comprises a plurality of direct current input terminals, the first circuit board is configured to receive currents from the plurality of direct current input terminals, and configured to output currents through at least one output terminal, wherein a number of the at least one output terminal is smaller than a number of the plurality of direct current input terminals.

* * * * *